(12) United States Patent
Jiang et al.

(10) Patent No.: US 6,264,486 B1
(45) Date of Patent: *Jul. 24, 2001

(54) ZERO INSERTION FORCE SOCKETS USING NEGATIVE THERMAL EXPANSION MATERIALS

(76) Inventors: Tongbi Jiang, 12036 W. Patrina Dr., Boise, ID (US) 83713; Zhiqiang Wu, 4012 Mildenhall Dr., Plano, TX (US) 75093

(*) Notice: Subject to any disclaimer, the term of this patent is extended or adjusted under 35 U.S.C. 154(b) by 0 days.

This patent is subject to a terminal disclaimer.

(21) Appl. No.: 09/630,977

(22) Filed: Aug. 2, 2000

Related U.S. Application Data

(63) Continuation of application No. 09/248,932, filed on Feb. 12, 1999, now Pat. No. 6,164,993.

(51) Int. Cl.⁷ .................................................. H01R 13/20
(52) U.S. Cl. ........................................... 439/161; 174/260
(58) Field of Search .................................... 439/161, 932, 439/83; 174/260, 262, 265; 361/764, 772, 773

(56) References Cited

U.S. PATENT DOCUMENTS

| | | | |
|---|---|---|---|
| 4,950,173 | * | 8/1990 | Minemura et al. ................... 439/161 |
| 5,497,545 | * | 3/1996 | Watanabe et al. ...................... 439/83 |
| 5,607,313 | * | 3/1997 | Nyman .................................... 439/83 |
| 5,641,291 | * | 6/1997 | Sueki et al. ............................. 439/83 |
| 5,919,720 | * | 7/1999 | Leight et al. ......................... 501/126 |

* cited by examiner

*Primary Examiner*—Tulsidas Patel
(74) *Attorney, Agent, or Firm*—Hugh R. Kress; Winstead Sechrest Minick, P.C.

(57) ABSTRACT

A socket device for receiving a connection pin is disclosed, the socket device including a substrate having an upper surface. The socket device includes a connection pad disposed on the upper surface and a first layer disposed on the upper surface and on the connection pad. The first layer includes material having an overall positive coefficient of thermal expansion. The socket device includes a second layer disposed on the first layer. The second layer includes material having an overall negative coefficient of thermal expansion. The socket device also includes a contact hole formed in the first and second layers exposing a portion of the connection pad.

15 Claims, 2 Drawing Sheets

ZERO INSERTION FORCE SOCKETS USING NEGATIVE THERMAL EXPANSION MATERIALS

This is a continuation of application Ser. No. 09/248,932 filed Feb. 2, 1999 now U.S. Pat. No. 6,164,993.

BACKGROUND OF THE INVENTION

1. Field of the Invention

This invention relates generally to the field of integrated circuits, and, more particularly, to integrated circuit devices having offset junctions to protect circuits from an electrostatic discharge (ESD) and methods for their manufacture.

2. Description of the Related Art

Electrical components are often mounted in sockets comprising spring contacts. These sockets allow easy installation and replacement of electrical elements. With conventional sockets, the terminal pins of an integrated circuit (IC) are pressed into a socket and deflect the spring contacts.

Modern integrated circuits are often complex and may have a large number of pins. While the force required to insert an individual pin into a socket receptacle is modest, simultaneously inserting a large number of pins into their respective sockets can require a significant insertion force. The insertion force can damage the integrated circuit or bend the pins when the force is significant or when the sockets and pins are not properly aligned.

To avoid the problem of damaging the IC or the pins, various kinds of zero insertion force (ZIF) sockets have been developed, whereby the terminal pins of an IC can be inserted into and withdrawn from such sockets with minimal or no insertion and withdrawal force. This facilitates easy change or replacement of the IC, which is often necessary.

A widely used conventional zero insertion force socket substantially includes a socket housing having a plurality of metallic conductive contacts disposed in the insertion holes. The insertion holes of the socket are adapted to receive multiple terminal pins of an IC. According to the zero insertion force arrangement, during the insertion and withdrawal of the IC from the socket, the IC will suffer little or no resistant force from the contacts of the socket. After the pins are inserted into the insertion holes, an operation lever is moved to push a movable plate disposed over the socket housing. The plate then slides a small distance (usually 1 mm) relative to the socket housing, whereby the terminal pins are urged to move toward the contacts and squeeze into a space between two opposite conductive elastic plates comprising the contacts.

Several shortcomings may be perceived in the conventional structure. Typical ZIF sockets are advantageously used to receive large dies or packages, for example a Pentium™ chip. For smaller-scale socket devices, for example a "flip chip" assembly, the dies or packages are too small to be mechanically processed practically with a through-hole type ZIF socket employing the offset method discussed above. In addition, as the package size becomes smaller, the proximity of the pins to one another becomes so close that the pins sometimes come into contact with one another and short the circuit.

The present invention is directed to overcoming, or at least reducing the effects of, one or more of the issues set forth above.

SUMMARY OF INVENTION

In accordance with one aspect of the present invention, a socket device for receiving an IC terminal pin or solder ball is provided. The socket device includes a substrate having an upper surface, a connection pad disposed on the upper surface of the substrate and a first layer disposed on the upper surface and on the connection pad. The first layer includes material having an overall positive coefficient of thermal expansion. The socket device includes a second layer disposed on the first layer. The second layer includes material having an overall negative coefficient of thermal expansion. The socket device also includes a contact hole formed in the first and second layers exposing a portion of the connection pad which is receptive of a pin. In an alternative embodiment the socket device only includes the negative coefficient of thermal expansion layer.

BRIEF DESCRIPTION OF THE DRAWINGS

The foregoing and other features and aspects of the invention will become further apparent upon reading the following detailed description and upon reference to the drawings in which.

Figure 1:
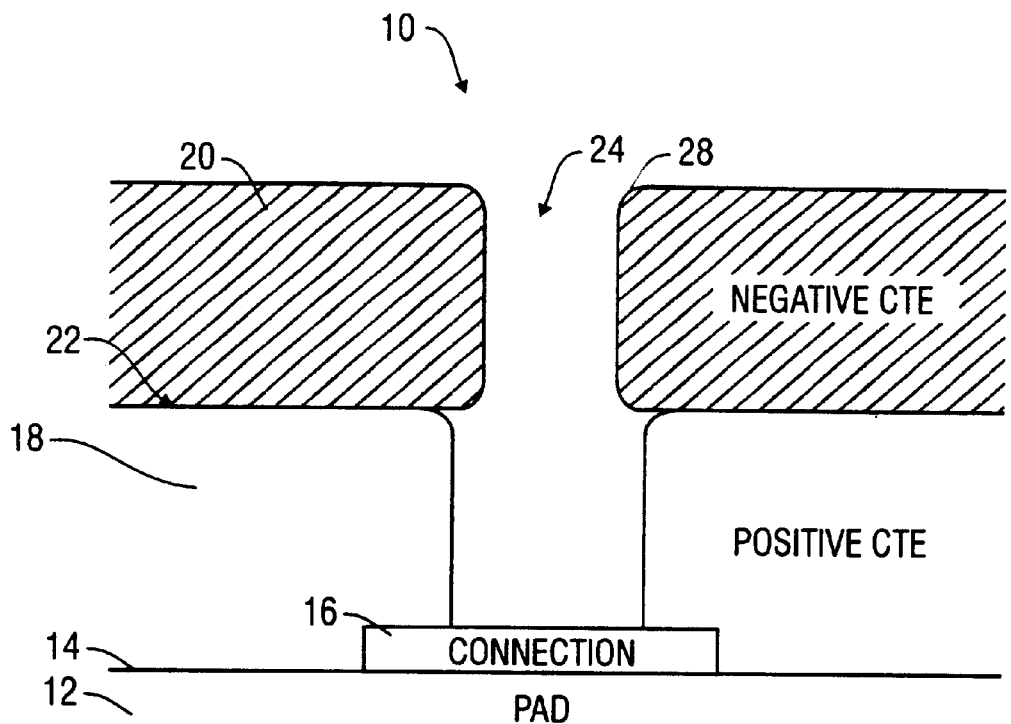
FIG. 1 is a cross-sectional view of the socket device at room temperature.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, that will vary from one implementation to another. Moreover, it will be appreciated that such a development effort might be complex and time-consuming, but would nevertheless be a routine undertaking for those of ordinary skill in the art having the benefit of this disclosure.

Turning now to the drawings, and in particular to FIG. 1, one embodiment of the socket device in accordance with the present invention is disclosed. The zero insertion force socket 10 comprises a substrate 12 with an upper surface 14, a connection pad 16, a first layer 18 disposed on the substrate 12 and connection pad 16, and a second layer 20 disposed on the first layer 18.

Substrate 12, for example a ceramic or organic substrate, comprises a base of the socket device 10 upon which the socket is built. Substrate 12 may also comprise a die/package of the another socket assembly upon which the next socket is built. Connection pad 16 is disposed on the upper surface of substrate 12 and attached thereto by a photo define/etch method. Also disposed on the upper surface of substrate 12 and on connection pad 16 is first layer 18. First layer 18 is bonded to substrate 12 in a way similar to the connection pad by a spin-on and photo define/etch method or drilling. In accordance with one aspect of the invention first layer 18 comprises material with an overall positive coefficient of thermal expansion, indicating that the material will expand as temperature is elevated and contract as temperature decreases. In one embodiment, first layer 18 comprises silicon oxide $SiO_2$, silicon nitride $Si_3N_4$, a polyimide, or similar materials. When substrate 12 comprises ceramic or organic material, first layer 18 preferably comprises polyimide or other organic material. However, when substrate 12 is comprises a die or package, first layer 18 preferably comprises silicon oxide or silicon nitride. In an alternative embodiment, first layer 18 may be absent from the socket device.

Disposed on the upper surface of first layer 18 is second layer 20. In accordance with another aspect of the invention second layer 20 comprises materials with an overall negative coefficient of thermal expansion, indicating that the second layer contracts with a temperature elevation and expands with a temperature decrease. The second layer material preferably has a wide temperature range for which the material exhibits the negative expansion behavior, in order to accommodate use of the socket device in apparatuses with various operation temperatures. One material exhibiting the behavior desirable for the purposes of practicing the present invention is zirconium tungstate $ZrW_2O_8$. The zirconium tungstate may be a single crystal $ZrW_2O_8$, an amorphous $ZrW_2O_8$, or a polymer bound $ZrW_2O_8$. Those of ordinary skill in the art will appreciate that zirconium tungstate exhibits a negative coefficient of thermal expansion over the desired wide range of temperatures, from near absolute zero to 1050° K., its decomposition temperature. Second layer 20 is bonded to first layer 18 with a compliant interfacial layer 22 that allows first layer 18 and second layer 20 to remain bonded to one another despite the opposite tendencies of the layers to contract and expand with temperature changes. The interfacial layer 22 material, for example Hitachi's HF-X20, is such that it absorbs the stress between the first and second layers as the opposing movement between layers occurs.

Figure 2A:
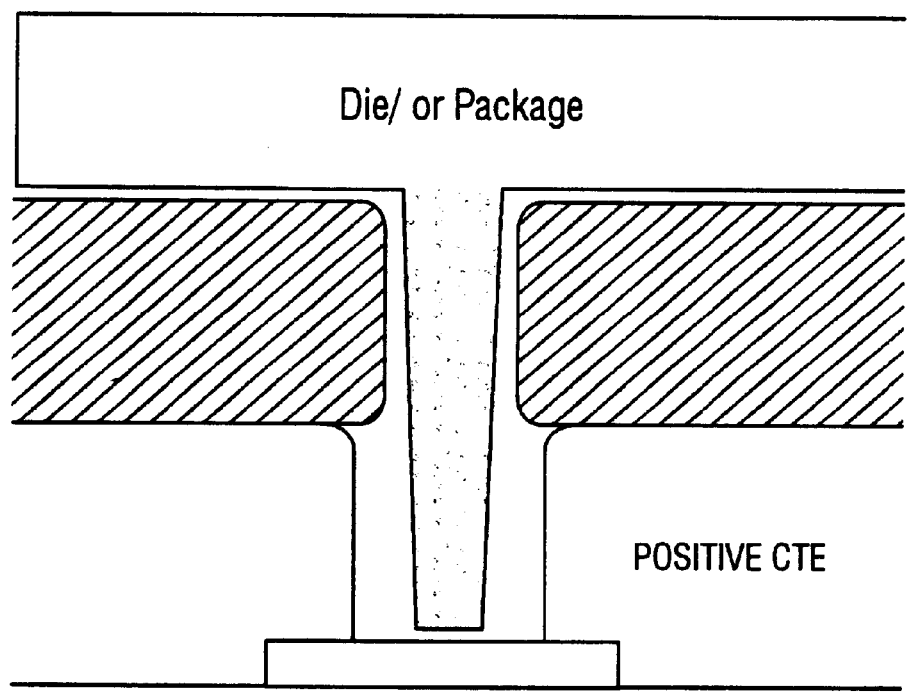
FIG. 2a is a cross-sectional view of the socket device at an elevated temperature with a pin inserted into the socket.

Both first and second layers 18 and 20, respectively, exhibit a connection hole 24 therethrough to expose a portion of the surface of connection pad 16. Connection hole 24 is etched using current technologies, such as photo lithography or laser drilling. Connection hole 24 is receptive of an integrated circuit pin 26 with zero insertion force at elevated temperatures. FIG. 2a shows the socket in an elevated temperature condition with pin 26 inserted into connection hole 24. The portion of connection hole 24 formed in first layer 18 has a linear dimension that is larger than the portion of connection hole 24 formed in second layer 20, the advantage of which being discussed in further detail below. Connection hole 24 through both layers 18 and 20 is substantially larger in dimension than pin 26 when the socket is at elevated temperatures. Connection hole 24 being larger than pin 26 ensures that as pin 26 is inserted or retracted there are no forces required that could potentially damage the pin or the associated integrated circuit. Connection hole 24 is chamfered at the point designated with reference numeral 28, around the upper perimeter of second layer 20 to act as self-guidance during pin insertion. Chamfer 28 may be accomplished by facet etching or other methods, as would be appreciated by those of ordinary skill in the art.

Operation of socket device 10 is as follows: socket device 10 is raised to an elevated temperature in anticipation of receiving pin 26. The temperature to which the socket device is elevated is such that it is substantially higher than the temperature at which the device will ultimately be operated. For example, if the socket device is intended to be used in a CPU that has a normal operating temperature of 100° C., the temperature to which the socket might be brought prior to insertion of the pin might be 200–250° C. When socket 10 is raised to an elevated temperature, second layer 20 contracts, enlarging connection hole 24 through second layer 20. The elevated temperature has the opposite effect for connection hole 24 through first layer 18 of the device. The higher temperature causes first layer 18 to expand and therefore decreases the size of connection hole 24 through the first layer. Because connection hole 24 through first layer 18 becomes smaller with elevated temperatures, connection hole 24 through first layer 18 has a larger dimension at operating temperatures than connection hole 24 through second layer 20, to ensure a hole through both layers 18 and 20 large enough to accommodate receipt of pin 26 without any insertion force at elevated temperatures. This larger dimension of connection hole 24 through first layer 18 may continue to be exhibited at elevated temperatures if the mounting temperature is greater than the operating temperature.

When an elevated temperature for the socket device 10 has been achieved, the socket can receive pin 26 with zero insertion force. FIG. 2a exhibits socket device 10 with pin 26 inserted while the device is in an elevated temperature condition. The insertion of pin 26 in this elevated temperature environment leaves pin 26 in substantially close proximity to connection pad 16, but short of full contact, as shown in FIG. 2a.

Following the insertion of pin 26, the socket and pin combination are removed from the elevated temperature condition. As the environment temperature decreases, second layer 20, which has a surface in direct contact with the lower temperature medium, begins to cool. Second layer 20 is subject to cooling by two modes of heat transfer: Conduction via direct contact with the cooler environment, and convection, as natural or forced convection currents are established. First layer 18 will also begin to cool by the conduction mode of heat transfer as second layer 20, with which first layer 18 is bonded, continues to dissipate heat. However, first layer 18 will not be cooled by convection since it is insulated from the lower temperature environment by a boundary layer comprising second layer 20. Thus second layer 20 will cool more quickly than first layer 18 because first layer 18 only cools as it transfers heat conductively to relatively cooler second layer 20. As second layer 20 cools, connection hole 24 through second layer 20 becomes smaller, due to the negative coefficient of thermal expansion behavior exhibited by the second layer material. When second layer 20 cools sufficiently, the inner diameter of connection hole 24 through second layer 20 will make contact with the circumferential surface of pin 26. The shrinking of connection hole 24 through second layer 20 continues and pin 26 is secured within socket 10. Connection hole 24 is sized so as to secure pin 26 in place at temperatures substantially near or below the normal operating temperature of the equipment into which the IC and socket are placed.

Figure 2B:
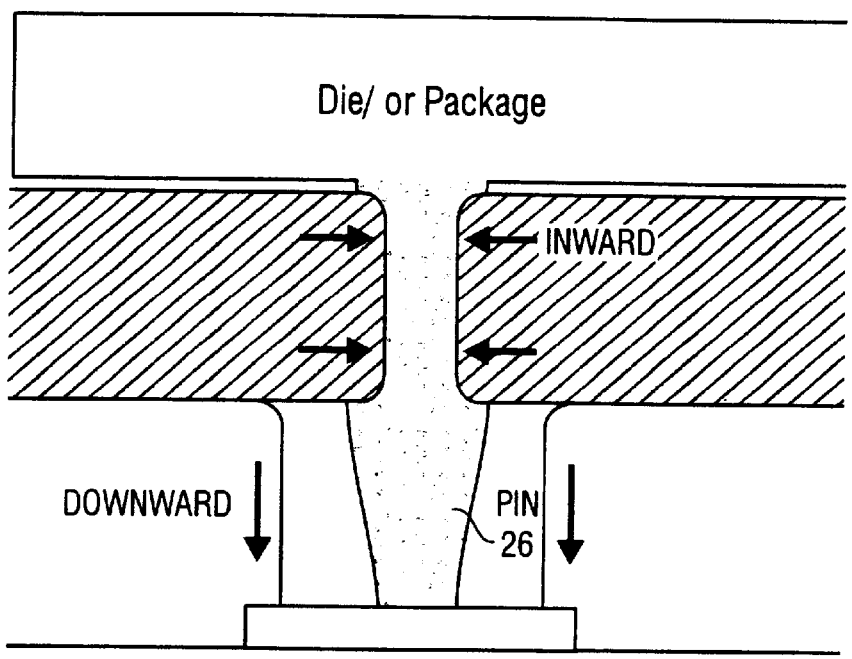
FIG. 2b is a cross-sectional view of the socket device at normal operating temperature with the pin inserted into the socket.

After pin 26 has been secured in place, as shown in FIG. 2b, the cooling of socket device 10 continues. First layer 18, which has been slower to cool than second layer 20, begins to contract in accordance with a material having a positive coefficient of thermal expansion in a cooler environment. The results of first layer 18 contraction are a larger connection hole 24 through first layer 18, an increase in the annular space between the circumferential surface of pin 26 and the inner surface of connection hole 24, and a reduction in the thickness of first layer 18. When the dimensions of first layer 18 reduce, second layer 20 moves into closer proximity with substrate 12. This occurs because second layer 20 is bonded to first layer 18. The movement of second layer 20 toward the upper surface of substrate 14 concurrently urges pin 26, which is secured within connection hole 24, into contact with connection pad 16. Socket insertion is complete upon contact between pin 26 and connection pad 16.

If it becomes desirable to remove pin 26 from the socket, the socket/pin assembly need only be re-elevated to a temperature such that connection hole 24 in second layer 20 enlarges and releases pin 26. Pin 26 can then be retracted from the socket with zero retraction force. The cycle of heating and cooling to allow for insertion and retraction pins is indefinitely repeatable.

Figure 3:
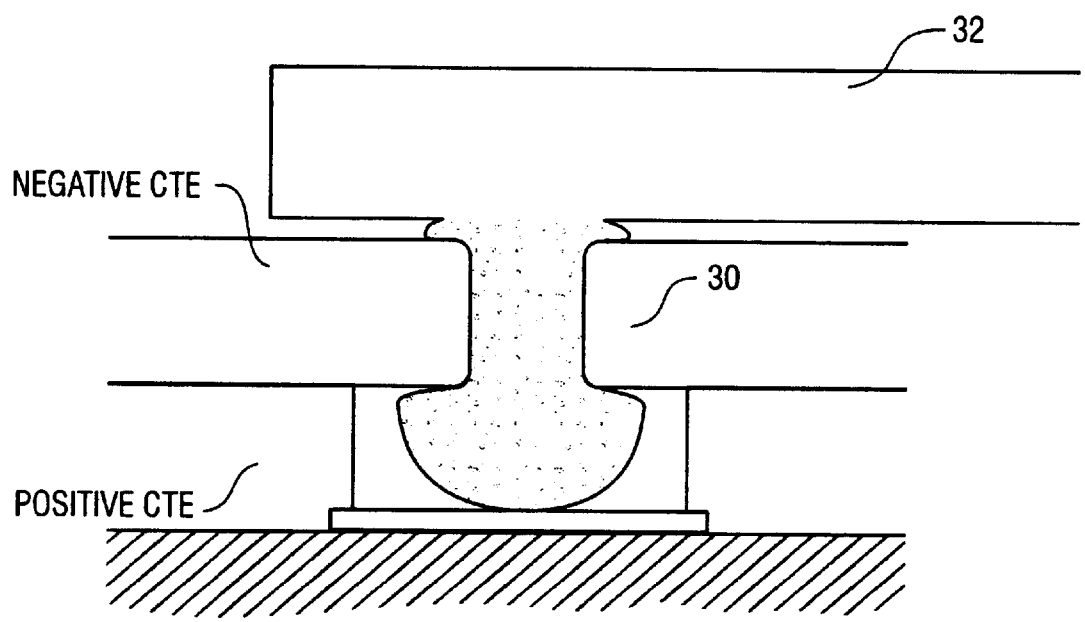
FIG. 3 is a cross-sectional view of the socket device at normal operating temperature with a solder ball/die inserted into the socket.

In an alternative embodiment depicted in FIG. 3, a socket device 10' is receptive of a solder ball 30 connected to a die 32 instead of a pin. Those of ordinary skill in the art having the benefit of the present disclosure will appreciate that the insertion and retraction of solder ball 30 comprises the same operation as for pin 26 described above.

While the present invention has been particularly shown and described with reference to various illustrative embodiments thereof, it will be understood by those skilled in the art that various changes in form and details may be made without departing from the spirit and scope of the invention. The above-described embodiments are intended to be merely illustrative, and should not be considered as limiting the scope of the present invention.

What is claimed is:

1. A socket assembly for receiving a connecting pin from an electronic component, comprising:

a substrate having an upper surface;

a connection pad disposed on said upper surface of said substrate;

a layer of first material disposed over said upper surface of said substrate, said layer of first material having an aperture formed therein to expose at least a portion of said connection pad;

wherein said first material has an overall negative coefficient of thermal expansion.

2. A socket assembly in accordance with claim 1, further comprising:

a layer of second material disposed beneath said layer of first material, said layer of second material having an aperture formed therein to expose at least a portion of said connection pad.

3. A socket assembly in accordance with claim 2, wherein said second material has an overall positive coefficient of thermal expansion.

4. A socket assembly in accordance with claim 1, wherein said aperture in said layer of first material has dimensions such that at a temperature substantially above a range of normal operating temperatures of said electronic component, said aperture expands to permit insertion and removal of said connecting pin with minimal force.

5. A socket assembly in accordance with claim 4, wherein when cooled to a temperature within said range of normal operating temperatures of said electronic component while said connecting pin is inserted in said aperture, said aperture contracts around and secures said connecting pin.

6. A socket assembly in accordance with claim 1, wherein said wherein said second material is zirconium tungstate.

7. A socket assembly in accordance with claim 6, wherein said zirconium tungstate is single-crystal zirconium tungstate.

8. A socket assembly in accordance with claim 6, wherein said zirconium tungstate is amorphous zirconium tungstate.

9. A socket assembly in accordance with claim 6, wherein said zirconium tungstate is polymer bound zirconium tungstate.

10. A socket assembly in accordance with claim 2, wherein said second material is a material selected from the group: silicon oxide, silicon dioxide, silicon nitride, and $Si_3N_4$.

11. A socket assembly in accordance with claim 2, wherein said second material is a polyimide.

12. A socket assembly in accordance with claim 2, further comprising:

an interfacial material between said layer of first material and said layer of second material, said interfacial material adapted to permit relative movement between said layer of first material and said layer of second material.

13. A socket assembly in accordance with claim 1, wherein said substrate is ceramic.

14. A socket assembly in accordance with claim 1, wherein said layer of first material is bonded to said substrate using a spin-on and photo define/etch process.

15. A socket assembly in accordance with claim 2, wherein said aperture comprises a first aperture in said layer of first material and a second aperture in said layer of second material, wherein said second aperture has a linear dimension smaller than said first aperture.

* * * * *

UNITED STATES PATENT AND TRADEMARK OFFICE
CERTIFICATE OF CORRECTION

PATENT NO. : 6,264,486 B1
DATED : July 24, 2001
INVENTOR(S) : Tongbi Jiang and Zhiqiang Wu Page 1 of 1

It is certified that error appears in the above-identified patent and that said Letters Patent is hereby corrected as shown below:

<u>Column 6, claim 6,</u>
Lines 17-18, should read -- first -- instead of "wherein said second".

<u>Column 6, claim 14,</u>
Line 43, should read -- second -- instead of "first".

<u>Column 6, claim 15,</u>
Line 49, should read -- larger -- instead of "smaller".

Signed and Sealed this

Sixteenth Day of April, 2002

Attest:

JAMES E. ROGAN
*Attesting Officer*   *Director of the United States Patent and Trademark Office*